United States Patent [19]
Fang et al.

[11] Patent Number: 5,604,136
[45] Date of Patent: Feb. 18, 1997

[54] METHOD OF MANUFACTURING LIGHT CONVERTER WITH AMORPHOUS-SILICON PIN HETEROJUNCTION DIODE

[75] Inventors: Yean-Kuen Fang, Tainan City; Kuen-Hsien Lee, Taichung City; Yaw-Jou Yang, Nantu Hsien; Lee-Ching Kuo, Hsinchu City, all of Taiwan

[73] Assignee: National Science Council, Taipei, Taiwan

[21] Appl. No.: 452,313

[22] Filed: May 26, 1995

[51] Int. Cl.$^6$ ................................................. H01L 21/208
[52] U.S. Cl. ............................ 437/23; 437/127; 437/906
[58] Field of Search ............................ 437/23, 127, 133, 437/906; 257/256, 257, 430, 458, 656

[56] References Cited

U.S. PATENT DOCUMENTS

| | | | |
|---|---|---|---|
| 4,211,586 | 7/1980 | Fang et al. | 437/127 |
| 5,055,894 | 10/1991 | Chan | 257/458 |
| 5,068,204 | 11/1991 | Kukimoto et al. | 437/127 |

FOREIGN PATENT DOCUMENTS

| | | | |
|---|---|---|---|
| 6073465 | 6/1981 | Japan | 257/656 |
| 6162866 | 12/1981 | Japan | 257/656 |
| 0213378 | 9/1988 | Japan | 437/23 |

*Primary Examiner*—R. Bruce Breneman
*Assistant Examiner*—Mara Ronda
*Attorney, Agent, or Firm*—Lackenbach Siegel Marzullo Aronson & Greenspan, P.C.

[57] ABSTRACT

A method of manufacturing a light converter with an LED and an amorphous-silicon pin heterojunction diode includes steps of a) preparing an LED structure on one side of a substrate as a light-emitting unit; b) forming a buffer layer on the other side of the substrate; and c) depositing a pin (positive type/intrinsic type/negative type) diode on the buffer layer as a light-absorbing unit this blue/red light converter, and the value of rise time obtained under 1 kfΩ is 112.5 μsec. The present invention desirably lower the cost, simplify the preparation process, and avoids degrading features of a light converting unit by over-heating during the process of preparing the pin diode.

19 Claims, 5 Drawing Sheets

METHOD OF MANUFACTURING LIGHT CONVERTER WITH AMORPHOUS-SILICON PIN HETEROJUNCTION DIODE

FIELD OF THE INVENTION

The present invention is related to a method of manufacturing a light converter, and more particularly to a method of manufacturing a light converter with amorphous-silicon pin heterojunction diode.

BACKGROUND OF THE INVENTION

In the prior art, a structure integrating a light-absorbing unit and a light emitting unit has been proposed for constructing OEIC (Optical Electrical Integrated Circuit) devices such as a light amplifier, a light switching element, a light transmitter, . . . etc. However, no one ever suggests a light converter based on this sort of structure. Moreover, most of the light-absorbing element and the light-emitting unit used in the structure are made of compound materials selected frown either common or different types of II–VI or III–V groups which are expensive due to their poor availability. Besides, the preparation of these materials requires a high-temperature process which results in the degradation of the light-emitting unit formed under the light-absorbing unit, and further degrades the performance of the entire OEIC device.

SUMMARY OF THE INVENTION

An object of the present invention is to provide a method of manufacturing a light converter by integrating an LED and a pin (positive type/intrinsic type/negative type) heterojunction diode which combines a light-absorbing unit and a light-emitting unit to construct a light converter applicable in some specific optical communication applications for converting UV or visible light received into light of other color, e.g., blue light or green light.

Another object of the present invention is to provide a method of manufacturing a light converter by integrating an LED and a pin heterojunction diode which uses amorphous-silicon as the material of the light-absorbing unit to lower the cost.

Another further object of the present invention is to provide a method of manufacturing a light converter by integrating an LED and a pin heterojunction diode which employs a low-temperature process to avoid degradation of units.

In accordance with the present invention, the present invention provides a method of manufacturing a light converter with an LED and a amorphous-silicon pin heterojunction diode including steps of (a) preparing an LED structure on one side of a substrate as a light-emitting unit for the light converter; (b) forming a buffer layer on the other side of the substrate; and (c) depositing a pin (positive type/intrinsic type/negative type) diode on the buffer layer as a light-absorbing unit for the light converter.

Step (b) can further include (b1) forming an Au/Ge layer on the other side of the substrate, and (b2) forming a layer of indium-tin-oxide on the Au/Ge layer.

Step (c) can be executed in a plasma-enhanced CVD (PECVD) system.

The method according to the present invention may further include between steps (a) and (b) a step of lapping and cleaning the substrate, and in step (a), a layer of Al is formed on the LED structure by evaporation to function as an electrode for the light converter.

After step (a), a step of depositing an Al layer on the LED structure as an ohmic contact electrode can also be included.

Following step (c), the present method further may include a step of forming an indium-tin-oxide layer on the pin heterojunction diode.

The LED can be made of a compound material selected from II–VI groups, e.g., the LED can be made of ZnSe emitting a blue light.

The LED can be made of a compound material selected from III–V groups, e.g., the LED can be made of GaAlAs emitting a red light, GaAsP emitting a yellow light, or GaAlAsP emitting an ultra red light.

Also the LED can be made of GaAsP emitting a red light and the substrate is made of a negative type of GaAs (n-GaAs) wherein a thickness of the substrate can be about 300 µm, and the GaAsP red light emitting diode has a structure that can be shown as:

n-GaAs$_{1-x}$P$_x$(X=0→0.4)/n-GaAs$_{1-x}$P$_x$(X=0.4)/p-GaAs$_{1-x}$P$_x$ where X stands for an atomic proportion, X=0→0.4 means an atomic proportion increases from 0 to 0.4, X=0.4 means the atomic proportion is 0.4, a thickness of the n-GaAs$_{1-x}$P$_x$(X=0→0.4) layer is about 10 µm, a thickness of the n-GaAs$_{1-x}$P$_x$(X=0.4) layer is about 20 µm, and a thickness of the p-GaAs$_{1-x}$P$_x$ layer is about 2 µm. Preferrably, when the light-emitting unit is a GaAsP red light emitting diode, the material of the substrate can be n-GaAs, e.g., GaAlAs, having a thickness of 300 µm. Moreover, the pin heterojunction diode can include a structure of positive type amorphous SiC:H/intrinsic type amorphous Si:H/negative type amorphous Si:H (p-a-SiC:H/i-a-Si:H/n-a-Si:H) where the p-a-SiC:H has a thickness of about 40Å, a thickness of the i-a-Si:H is in a range of about 200–2000Å, and the n-a-Si:H has a thickness of about 300Å. A thickness of the indium-tin-oxide layer can be about 1000Å.

Step c) is taken place in a low temperature of about 250° C. In accordance with another aspect of the present invention, a light converter fabricated with an LED and an amorphous-silicon pin heterojunction diode including an LED structure formed on one side of a substrate as a light-emitting unit for the light converter; a buffer layer formed on the other side of the substrate; and a pin amorphous structure formed of the buffer layer as a light-absorbing unit for the light converter.

The buffer layer may include an Au/Ge layer formed on the other side of the substrate, and an indium-tin-oxide layer attached on the Au/Ge layer.

The LED can be a red light emitting GaAsP LED having a structure of n-GaAs$_{1-x}$P$_x$(X=0→0.4)/n-GaAs$_{1-x}$P$_x$(X=0.4)/p-GaAs$_{1-x}$P$_x$ where X stands for an atomic proportion, X=0→0.4 means an atomic proportion increases from 0 to 0.4, X=0.4 means the atomic proportion is 0.4 and the amorphous pin heterojunction diode has a structure of positive type amorphous SiC:H/intrinsic type amorphous Si:H/negative type amorphous Si:H (p-a-SiC:H/i-a-Si:H/n-a-Si:H) where the substrate is an n-GaAs substrate.

The present invention may best be understood through the following description with reference to the accompanying drawings, in which:

DETAILED DESCRIPTION OF THE PREFERRED EMBODIMENT

Figure 1:
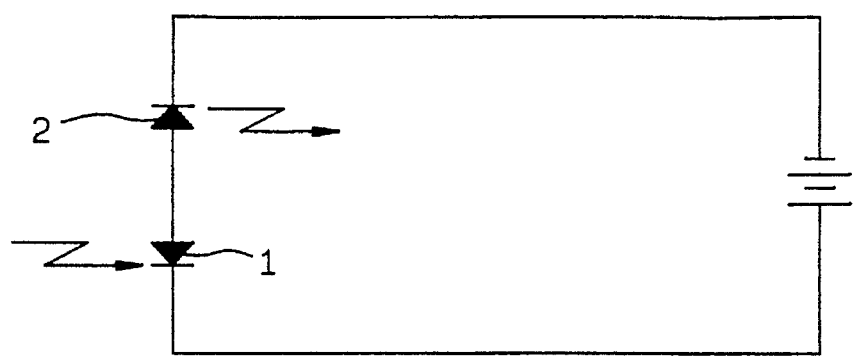
FIG. 1 is an equivalent circuit diagram of a light converting unit according to the present invention.

With reference to FIG. 1, there is shown a pin (positive type/intrinsic type/negative type) heterojunction diode 1 (referred to as pin diode hereinafter) and a LED 2 in the equivalent circuit diagram of a light converter according to the present invention integrating a light-absorbing unit and a light-emitting unit, wherein the pin heterojunction diode functions as the light-absorbing unit and the LED functions as the light-emitting unit. The pin diode 1 absorbs UV or visible light to generate photocurrent which thus drives the LED 2 to emit light. If the LED is a red light emitting diode, the output light is red light; if the LED is a green light emitting diode, the output light is green light, . . . so on and so forth.

Figure 2:
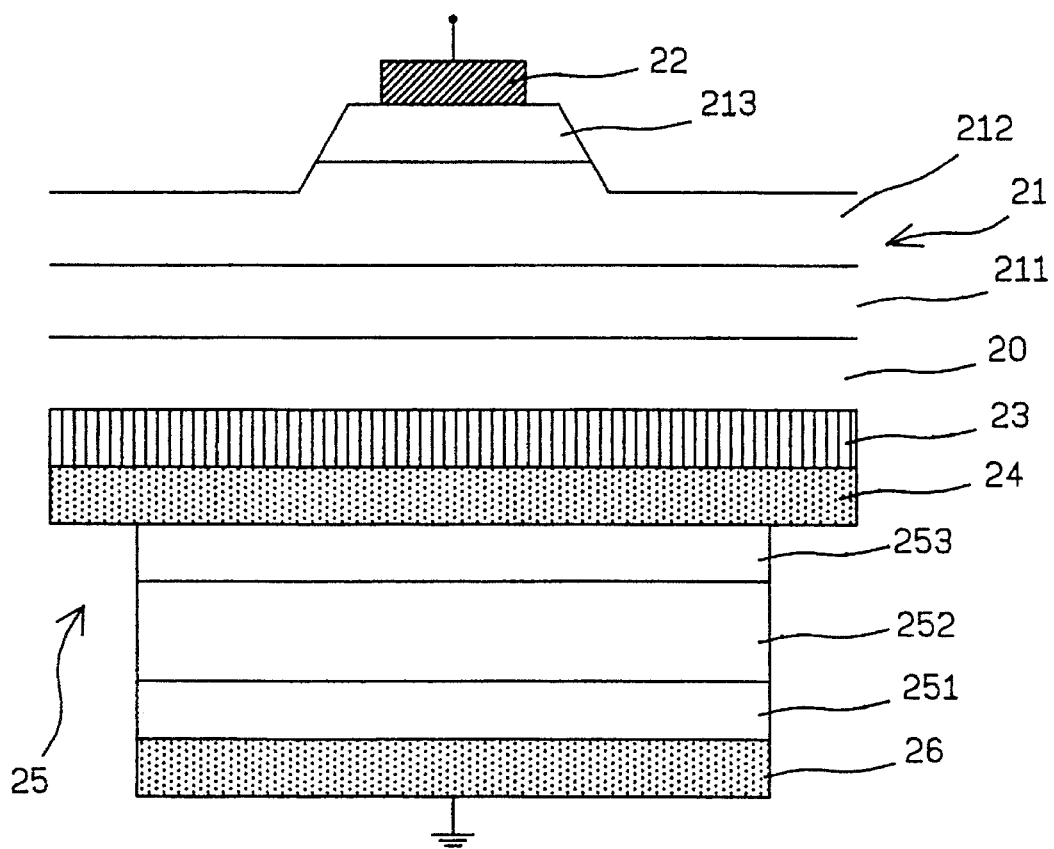
FIG. 2 is a schematic structural diagram of a preferred embodiment of a light converting unit according to the present invention.

FIG. 2 shows a preferred embodiment structure of a light converter according to the present invention. In the embodiment, an n-GaAs is used for the substrate, a GaAsP red light emitting diode is used as the light-emitting unit, and an amorphous-silicon pin diode of p-a-SiC:H/i-a-Si:H/n-a-Si:H is used as the light-absorbing unit. It is to be understood that different light-emitting units require substrates of different materials. For instance, when light-emitting unit is a blue light-emitting diode, the substrate can be made of ZnSe; when light-emitting unit is a blue light-emitting diode, it can be made of GaAsP; and when light-emitting unit is a red light-emitting diode, it can be made of GaAlAsP.

The manufacturing procedure of the embodiment is as follows:

1) growing an n-GaAsP red light emitting diode 21 (as an LED) by LPE (Liquid Phase Epitaxial) technique on one side of the n-GaAs substrate 20 in a thickness of 300 μm, wherein the structure of the n-GaAsP LED 21 includes: a layer of n-GaAs$_{1-x}$P$_x$(X=0→0.4) 211 having a thickness of 10 μm, a layer of n-GaAs$_{1-x}$P$_x$(X=0.4) 212, and a layer of p-GaAs$_{1-x}$P$_x$ 213, where X stands for an atomic proportion, X=0→0.4 means an involved atomic proportion increases from 0 to 0.4, X=0.4 means the relevant atomic proportion is 0.4, LED 21 is capable of emitting a red light with a wavelength equal to 6690Å, and the area of the GaAsP LED is 0.0625 cm$^2$;

2) evaporating a layer of Al 22 of a thickness of 1 μm on p-GaAsP 213 to provide an electrode of contact;

3) lapping and cleaning the other side of the n-GaAs substrate 20;

4) depositing and annealing a 10 μm-thick Au/Ge layer 23 under a rapid thermal annealing (RTA) procedure at 430° C. for 40 seconds;

5) depositing a layer of indium-tin-oxide 24 (referred to as ITO hereinafter) by electron-gun evaporation.

The Au/Ge layer 23 and the ITO layer 24 can serve as a buffer layer for growing thereon a layer of the amorphous-silicon pin diode that is easier to grow on the ITO layer 24 with more desirable quality. It is to be understood that the choice of the metal layer varys with the material of the substrate as long as an ohmic contact is formed therebetween. The buffer layer structure herein basically consisting of a metal layer and an ITO layer is formed between an amorphous-silicon piece and a substrate made of material selected from II–VI or III–V groups, in which the metal layer is able to form an ohmic contact with the substrate;

6) sequentially depositing p-a-SiC:H 251/i-a-Si:H 252/n-a-Si:H 253 layers, namely the pin diode 25, in a plasma-enhanced CVD (PECVD) system, where p-a-SiC:H 251 is of 40Å thickness, i-a-Si:H 252 is of 200–2000Å thickness, n-a-Si:H 253 is of 300Å thickness, and the area of the whole pin diode 25 is 0.385 cm$^2$;

7) depositing by E-gun evaporation a 1000Å-thickness ITO layer 26.

Figure 3:
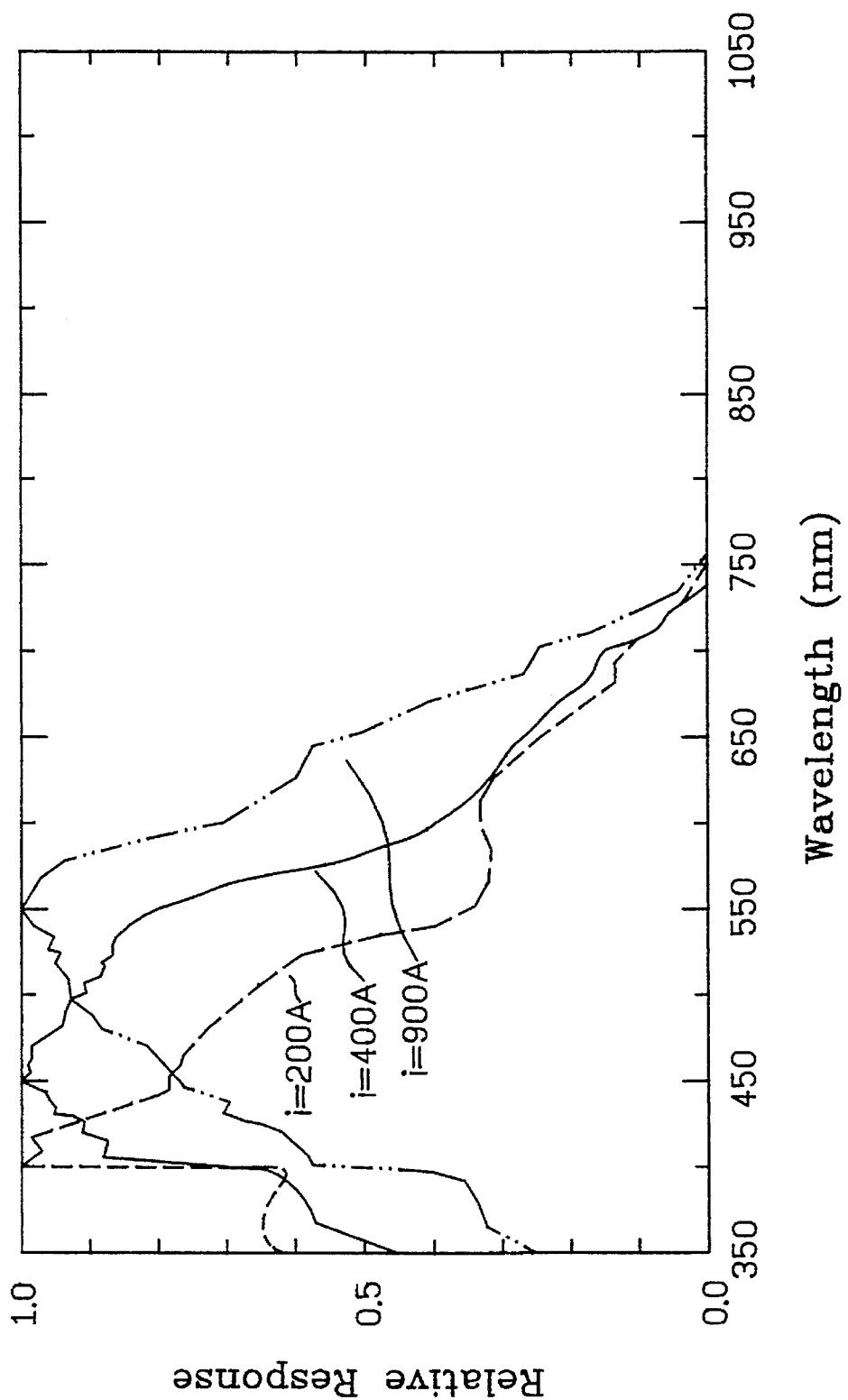
FIG. 3 is a spectral response diagram of an amorphous-silicon pin heterojunction diode according to the present invention with i-a-Si:H layers in thicknesses of 200Å, 400Å, and 900Å.
Figure 4:
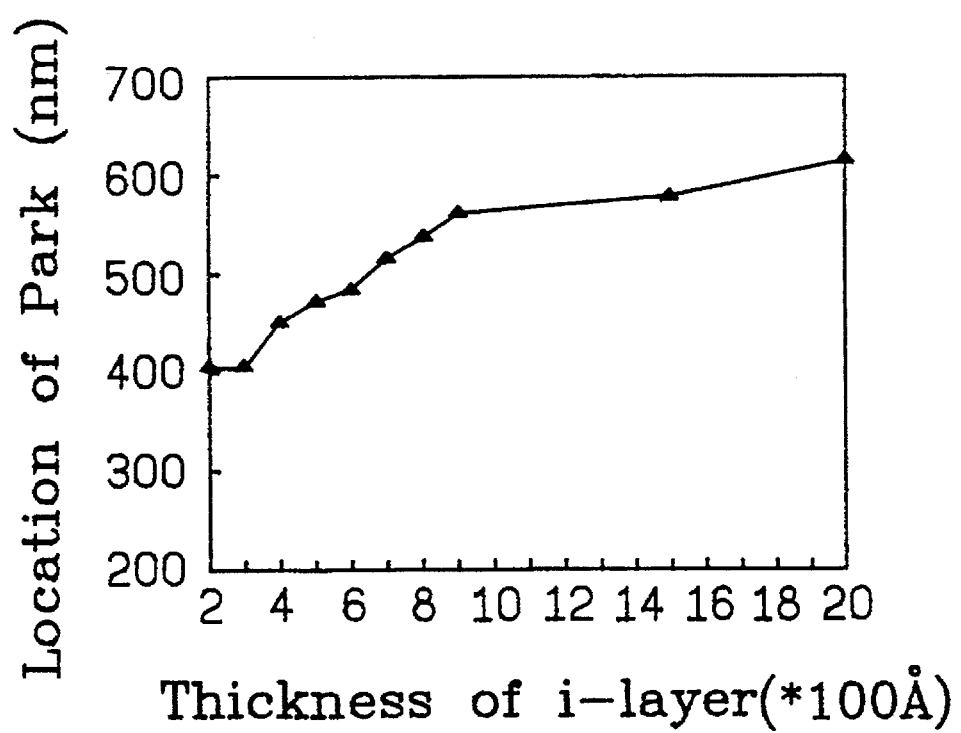
FIG. 4 is a relative diagram of the peak wavelength vs. the thickness of an i-a-Si:H layer in an amorphous-silicon pin heterojunction diode according to the present invention when the thickness of the i-a-Si:H layer changes from 200Å to 1000Å.

Referring to FIG. 3, i means the thickness of i-a-Si:H 252 layer in a pin diode 25, and the spectral response diagram shows that when i=200Å, 400Å, and 900Å, the peak spectral responses respectively occur at 400 nm, 450 nm, and 550 nm which are respectively within the wavelength regions of UV, blue light and green light. FIG. 4 is a relative diagram of peak wavelength vs. thickness of i-a-Si:H 252 layer, the thickness changing from 200Å to 2000Å. So called "peak wavelength" herein is defined to be the wavelength where the maximum spectral response of a light converting unit appears. It is to be seen from FIG. 4, the pin diode 25 according to the present invention can absorb lights of diverse wavelengths such as UV and visible lights, so as to be used as a light absorbing unit for a light converting unit.

Figure 5:
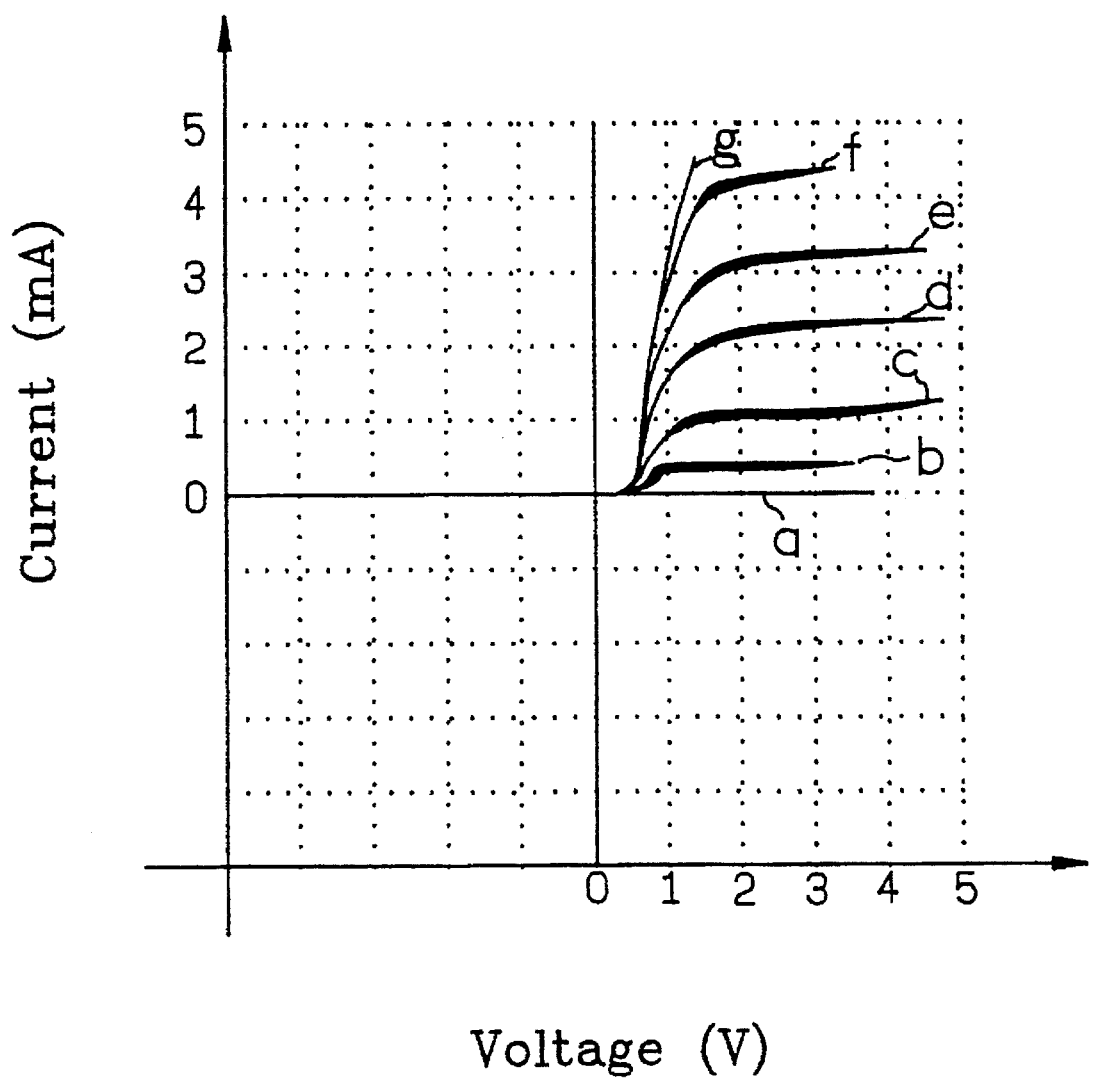
FIG. 5 is a photo response diagram of a light converter in a preferred embodiment (absorbing blue light and emitting red light) according to the present invention.
Figure 6:
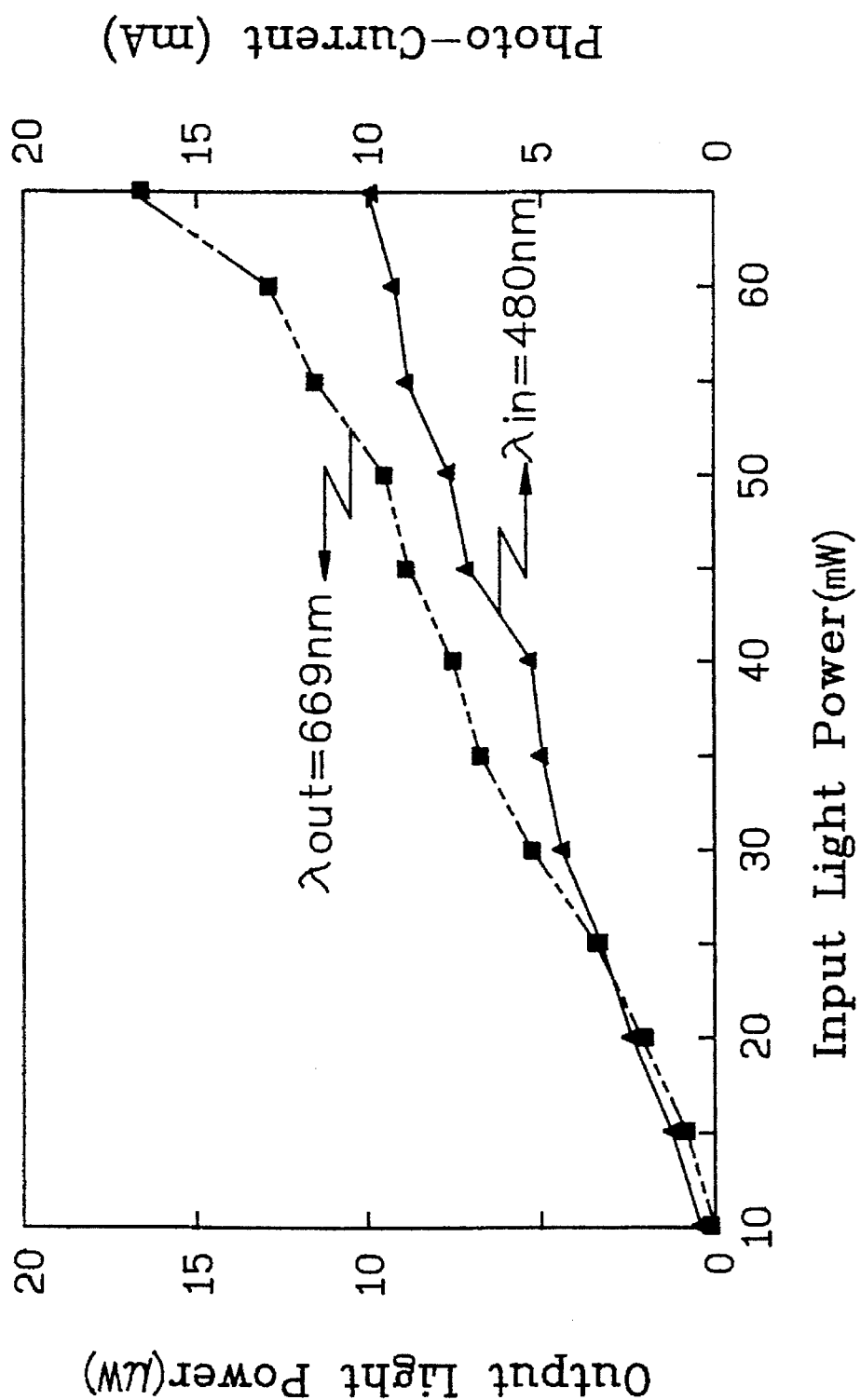
FIG. 6 is a diagram showing the light conversion characteristics of a blue/red light converter according to the present invention.

In the conversion of blue/red light, the thickness of i-a-Si:H layer 252 is 400Å, and as FIG. 3 shows, the pin diode has the maximum response at wavelength 450 nm (i.e., in blue light range), and thereby during operation, the ITO electrode 26 is biased positively and Al 22 electrode negatively, as shown in FIG. 1. At this time, the GaAsP LED 21 is forward-biased and the pin diode 25 is reverse-biased. FIG. 5 shows a photo response of pin diode 25 receiving various optical powers in the case of absorbing blue light and emitting red light, wherein Argon laser is used for the light source with wavelength 480 nm which is within the wavelength region of blue light, curve (a) is taken when there is no irradiation to the pin diode 25, and curves (b), (c), (d), (e), (f), and (g) are taken under optical powers respectively equivalent to 10 mw, 15 mw, 20 row, 25 mw, 30 mw, and 35 mw. It is to be seen from FIG. 5, when the pin diode is irradiated, photocurrent which can drive the GaAsP LED 21 to emit red light is generated therein and increases with increasing of input light power. FIG. 6 shows a curve that illustrates the light conversion characteristics of the light converter according to the present invention in the case when absorbing blue light and outputting red light. Besides, it can be seen in FIG. 6 that the output light power is proportional to the input light power. A response speed can be tested by this blue/red light converter, and the value of rise time obtained under 1 kΩ load is 112.5 μsec.

In a word, the present invention bears the following advantages:

1. Using an amorphous-silicon pin heterojunction diode prepared in a PECVD system which requires a low-temperature process (about 250° C.) as the light-absorbing unit, it can avoid degrading features of a light converting unit by over-heating during the process of preparing the pin diode.

2. Attributing to the inexpensiveness of amorpous-silicon, using an amorphous-silicon pin heterojunction diode as a light-absorbing unit in a light converter can lower the cost; besides, amorphous-silicon can be produced by large area.

3. By varying a thickness of an i-a-Si:H layer in an amorphous-silicon pin heterojunction diode, the input light source, e.g., UV or visible light, can be changed accordingly and converted into another light, e.g., red light, that is, the present invention provides a light converting unit which combines a light absorbing unit and a light emitting unit to be used in many applications.

4. The Au/Ge layer in the Au/Ge/ITO buffer layer serves to provide a desirable ohmic contact with the n-GaAs substrate, in addition to making it easier to grow a pin heterojunction diode on the ITO layer to the purpose of integrating a light-emitting unit and a light-absorbing unit.

5. The p-a-SiC:H layer included in an amorphous-silicon pin heterojunction diode can enhance the absorption of UV light.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of manufacturing a light converter with an LED and an amorphous-silicon pin heterojunction diode comprising the steps of:
   a) preparing a structure of said LED on one side of a substrate as a light-emitting unit;
   b) forming a buffer layer having a metal layer on the other side of said substrate and an indium-tin-oxide layer on said metal layer; and
   c) depositing said amorphous-silicon pin (positive type/intrinsic type/negative type) heterojunction diode on said buffer layer as a light-absorbing unit.

2. A method according to claim 1 wherein said step c) is executed in a plasma-enhanced CVD (PECVD) system.

3. A method as claimed in claim 1, further comprising between said steps (a) and (b) a step of lapping and cleaning said substrate.

4. A method as claimed in claim 3, further comprising after said step a) a step of depositing an Al layer on said LED structure as an ohmic contact electrode.

5. A method as claimed in claim 4, further comprising after said step c) a step of forming an indium-tin-oxide layer on said pin heterojunction diode.

6. A method as claimed in claim 5 wherein said LED is made of a compound material selected from II–VI groups.

7. A method as claimed in claim 6 wherein said LED is made of ZnSe emitting a blue light.

8. A method as claimed in claim 5 wherein said LED is made of a compound material selected from III–V groups.

9. A method as claimed in claim 8 wherein said LED is made of GaAlAs emitting a red light.

10. A method as claimed in claim 8 wherein said LED is made of GaAsP emitting a yellow light.

11. A method as claimed in claim 8 wherein said LED is made of GaAlAsP emitting an ultra red light.

12. A method as claimed in claim 8 wherein said LED is made of GaAsP emitting a red light and said substrate is made of a negative type of GaAs (n-GaAs).

13. A method as claimed in claim 12 wherein said GaAsP red light emitting diode has a structure that can be shown as:

n-GaAs$_{1-x}$P$_x$(X=0→0.4)/n-GaAs$_{1-x}$P$_x$(X=0.4)/p-GaAs$_{1-x}$P$_x$ where X stands for an atomic proportion, X=0→0.4 means an atomic proportion increases from 0 to 0.4, X=0.4 means said atomic proportion is 0.4, a thickness of said n-GaAs$_{1-x}$P$_x$(X=0→0.4) layer is about 10 μm, a thickness of said n-GaAs$_{1-x}$P$_x$(X=0.4) layer is about 20 μm, and a thickness of said p-GaAs$_{1-x}$P$_x$ layer is about 2 μm.

14. A method as claimed in claim 13 wherein a thickness of said substrate is about 300 μm.

15. A method as claimed in claim 14 wherein said pin heterojunction diode has a structure of positive type amorphous SiC:H/intrinsic type amorphous Si:H/negative type amorphous Si:H (p-a-SiC:H/i-a-Si:H/n-a-Si:H) where said p-a-SiC:H has a thickness of about 40Å, a thickness of said i-a-Si:H is in a range of about 200–2000Å, and said n-a-Si:H has a thickness of about 300Å.

16. A method as claimed in claim 15 wherein a thickness of said indium-tin-oxide layer is about 1000Å.

17. A method as claimed in claim 1 wherein step c) is taken place in a low temperature of about 250° C.

18. The method according to claim 1 in which said substrate comprises GaAs.

19. The method according to claim 18 in which said metal layer is an Au/Ge layer.

* * * * *